(12) United States Patent
Yokogawa

(10) Patent No.: US 6,787,802 B2
(45) Date of Patent: Sep. 7, 2004

(54) SEMICONDUCTOR DEVICE INCLUDING EVALUATION ELEMENTS

(75) Inventor: Shinji Yokogawa, Kawasaki (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/454,469

(22) Filed: Jun. 5, 2003

(65) Prior Publication Data

US 2003/0230810 A1 Dec. 18, 2003

(30) Foreign Application Priority Data

Jun. 12, 2002 (JP) ........................................ 2002-171222

(51) Int. Cl.$^7$ .............................................. H01L 23/58
(52) U.S. Cl. .......................................... 257/48; 438/14
(58) Field of Search ....................... 257/48, 758; 438/14

(56) References Cited

U.S. PATENT DOCUMENTS 5,900,735 A * 5/1999 Yamamoto .................. 324/537
6,614,049 B1 * 9/2003 Koyama ...................... 257/48

* cited by examiner

*Primary Examiner*—Phat X. Cao
(74) *Attorney, Agent, or Firm*—Young & Thompson

(57) ABSTRACT

In a semiconductor device including evaluation elements comprising a plurality of first wirings composed of a first wiring layer, a plurality of second wirings composed of a second wiring layer and vias connecting the first wirings and the second wirings, the first wirings and the second wirings are formed in directions almost perpendicular with each other, and relative to the plurality of first wirings juxtaposed with a prescribed interval, the plurality of second wirings connecting the adjacent first wirings are juxtaposed in the length direction of the first wirings, and a plurality of current paths are formed in parallel.

2 Claims, 2 Drawing Sheets

□ 1;FIRST LAYER  ▨ 3;VIA  □ 2;SECOND LAYER

□ 1;FIRST LAYER  ▨ 3;VIA  □ 2;SECOND LAYER

SEMICONDUCTOR DEVICE INCLUDING EVALUATION ELEMENTS

BACKGROUND OF THE INVENTION

1. Field of the Invention

The present invention relates to a semiconductor device, and more particularly to a semiconductor device including evaluation elements which is capable of specifying a failure location in nondestructive manner.

2. Description of the Prior Art

Conventionally, evaluation of electrical properties, quality, reliability, and the like of a semiconductor device has been conducted by forming a chain through serial connection of such elements as metal wirings and via-holes (vias for short) which is connected to an external measurement instrument by means of a probing or a wire bonding provided at both ends of the chain, and evaluating the electrical characteristics of the device using the external measurement instrument.

For example, in a reliability evaluation element shown in FIG. 2 and a via yield evaluation element shown in FIG. 4, an element is given a configuration in which a chain is formed by alternately connecting a metal wiring composed of a first layer 1 and a metal wiring composed of a second layer 2 by means of a via 3, connecting both ends of the chain to respective pads, and connecting the chain to an external measurement instrument from the pads through a probing or a wire bonding. With such a configuration, when an abnormality of wire breakage occurs in any one of the metal wirings or the vias 3, a disconnection will be observed as an electrical characteristic.

In general, as the methods of evaluating quality and reliability of a semiconductor device, there have been known nondestructive failure analysis techniques, such as the liquid crystal method which detects a locally heated location due to a current by utilizing birefringency of liquid crystals, the thermography which detects a heated location by using infrared rays, and the optical beam induced resistance change (OBIRCH) method and the non-bias optical beam induced current (NB-OBIC) method which measure a change in the current induced by laser beams, in addition to the appearance inspection and evaluation of electrical characteristics. Although the location where abnormality occurred can be specified by the methods just enumerated, when a disconnection is observed by the electrical characteristic evaluation using the conventional evaluation circuit described in the above, there has been a problem in that specification of abnormality location using nondestructive failure analysis methods such as the liquid crystal method, thermography, the OBIRCH method, the NB-OBIC method, and the like which require electrical measurement are invalid due to the loss of electrical connection to begin with.

Under these circumstances, the abnormality location is specified by employing a semi-destructive analysis method such as the potential contrast method that involves an observation by scanning electron microscopy (SEM) or a focused ion beam (FIB), so that it is necessary to remove all the covering films over the layer to be observed and hold the sample in a vacuum, which leads to a problem in that a complicated processing is required for the machining and the observation.

As described in the above, availability of almost all of the conventional evaluation circuits, which is so configured that all the elements are connected in series in order to maximize the detection sensitivity of abnormality of electrical characteristics, is invalidated due to the fact that the electrical connection is lost when an abnormality is observed under the circumstance that the nondestructive failure analysis often requires measurement of the electrical characteristics for the specification of abnormality location. It should be mentioned that a technique relevant to the present situation has been disclosed in J. of Appl. Phys., Vol. 90, No. 2, p. 732 (2001). However, the method is not regulating the wiring spacing (uses the minimum spacing in general), and is not presupposing its application to nondestructive failure analysis, so that it is of no help in solving the above problem.

BRIEF SUMMARY OF THE INVENTION

Summary of the Invention

In a semiconductor device including evaluation elements configured by a plurality of first wirings composed of a first wiring layer, a plurality of second wirings composed of second wiring layer and vias which connect the first wirings and the second wirings, the first wirings and the second wirings are formed in directions almost perpendicular with each other, a plurality of the second wirings that connect adjacent first wirings are juxtaposed in the length direction of the first wirings, with respect to the plurality of first wirings juxtaposed with a prescribed interval, to form a plurality of current paths in parallel.

BRIEF DESCRIPTION OF THE DRAWINGS

The above-mentioned and other objects, features and advantages of this invention will become more apparent by reference to the following detailed description of the invention taken in conjunction with the accompanying drawings, wherein.

DETAILED DESCRIPTION OF THE INVENTION

The semiconductor device according to the present invention is equipped in one preferable mode of embodiment with evaluation elements that are formed by connecting first layers and second layers, and vias that connect them into parallel chains. By setting the spacing between the vias and the spacing between the wirings to be larger than the diameter (for example, 1.3 $\mu$m) of the infrared laser beam, it is possible to maintain the connection as evaluation elements even if a part of the chain is disconnected, and as a result, it is possible to detect abnormality location by the use of a nondestructive failure analysis technique such as the OBIRCH method which observes the current path due to temperature change induced by the laser beam.

In order to describe in more detail the embodiments of the invention described in the above, the embodiments of the invention will be described by reference to the drawings.

Figure 1:
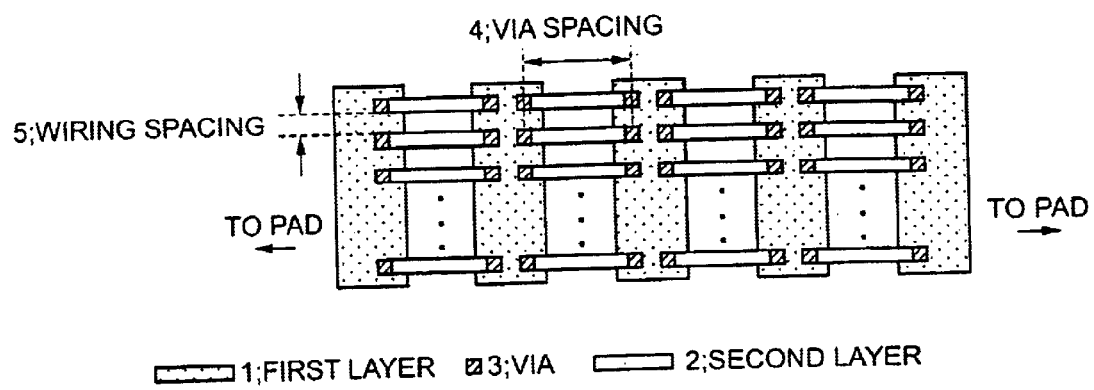
FIG. 1 is a bird's eye view showing schematically the configuration of reliability evaluation elements according to a first embodiment of the present invention.
Figure 2:
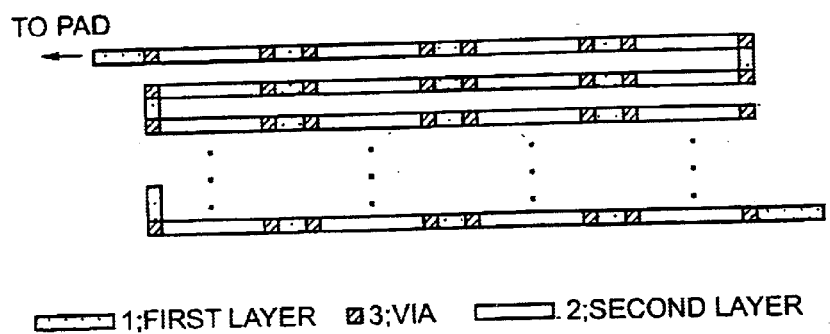
FIG. 2 is a bird's eye view showing schematically the configuration of conventional reliability evaluation elements.

First, referring to FIG. 1, a semiconductor device including evaluation elements according to a first embodiment of the invention, and a failure analysis method using the evaluation elements, will be described. FIG. 1 is a bird's eye view showing schematically the configuration of the reliability evaluation elements according to the first embodiment of the invention.

As shown in FIG. 1, the reliability evaluation elements are constituted of connection sections consisting of first layers 1, and elements to be evaluated consisting of vias 3 and second layers 2. In measuring the electrical characteristics, probing or wire bonding is applied to pads connected to the first layers at both ends, and an electrical characteristic such as the resistance is measured by using an external measurement instrument.

In this embodiment, since a plurality of the second layers 2 that connect one via to another via are arranged in parallel (in the top-bottom direction of FIG. 1), if a disconnection occurs in any one of the second layers 2, an abnormality is observed also in the measured electrical characteristic. In particular, in the reliability evaluation of electromigration, stress migration, temperature cycle resistance, or the like, it is possible to detect disconnection in either one of the second layers 2 or abnormality in the resistance by estimating the increment from the initial resistance.

Moreover, the present embodiment is characterize in that the spacing 5 between the wirings and the spacing 4 between the vias in FIG. 1 are set in advance to lengths which make the nondestructive failure analysis feasible. For example, when utilization of the OBIRCH method by which the observation of the current path due to temperature change induced by the laser beam is presupposed, it is possible to confirm which one of the second layers 2 is in abnormal condition by setting the wiring spacing 5 and the via spacing 4 not less than the diameter 1.3 $\mu$m of the infrared laser beam.

Accordingly, detection of abnormality location in an abnormal sample becomes possible without executing semi-destructive processing, by eliminating troublesome procedure for removal of covering films and sample holding in a vacuum, in order to carry out a simple but sure failure analysis.

Figure 3:
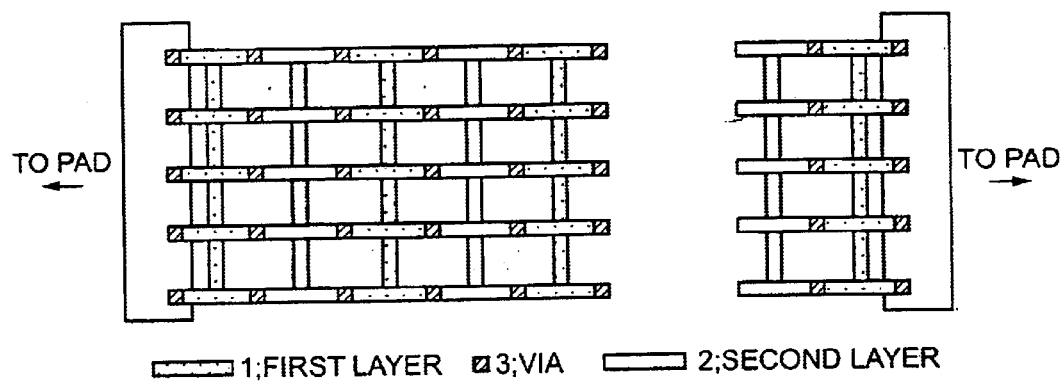
FIG. 3 is a bird's eye view showing schematically the configuration of via yield evaluation elements according to a second embodiment of the invention.

Next, referring to FIG. 3, a semiconductor device including evaluation elements according to a second embodiment of the invention, and a failure analysis method using the evaluation elements, will be described. FIG. 3 is a bird's eye view showing schematically the configuration of a via yield evaluation elements according to the second embodiment of the invention.

In the first embodiment in the above, an adaptation of the present invention to reliability evaluation elements is described, but the structure of the invention can also be adapted to yield evaluation elements. FIG. 3 shows the configuration when the invention is adapted to an example of via yield evaluation elements.

In this embodiment, chains consisting of first layers 1, second layers 2 and vias 3 are provided in parallel similar to FIG. 1 for the first embodiment, but this embodiment is characterized in that the spacings between the vias in the longitudinal and lateral directions are set in advance to lengths which permits a nondestructive failure analysis feasible.

Figure 4:
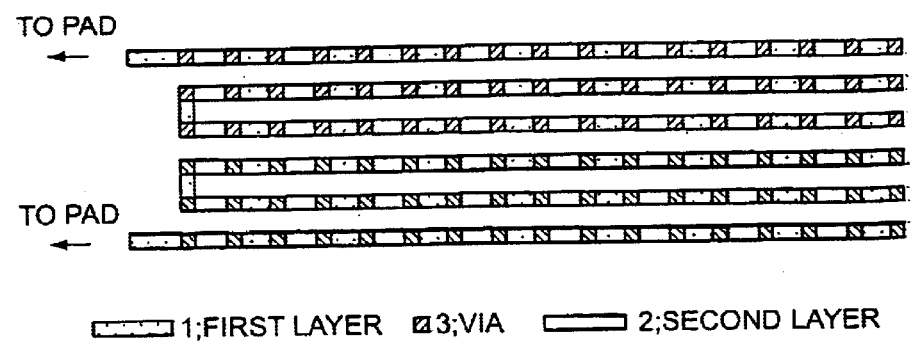
FIG. 4 is a bird's eye view showing schematically the configuration of the conventional via yield evaluation elements.

The normal yield of vias is carried out by an electrical characteristic evaluation of via chains connected in series as shown in FIG. 4. Since the resistance per unit via in that case is given by the value obtained by dividing the resistance between TEG terminals by the number of the chains, there is a possibility of failure in the detection of abnormality owing to the averaging when the number of vias with defective resistance is small. Moreover, when the defect is a disconnected resistor, the semi-destructive analysis becomes mandatory so that an easy physical analysis is hopelessly difficult.

In contrast, when the utilization of, for example, the OBIRCH method or the like is presupposed, it is possible in FIG. 3 to confirm by a nondestructive inspection which one of vias 3 is in abnormal state, by setting the spacing between adjacent vias to be not less than the diameter 1.3 $\mu$m of the infrared laser beam. In this way, it is possible to obtain information on the density and positional dependence of defective vias which cannot be acquired by the measurements of electrical characteristics.

As described in the above, according to the semiconductor device including evaluation elements of the present invention, the following effects can be exhibited Namely, a first effect of this invention is that even the case of disconnection in a part of the evaluation elements, the detection of the location of the abnormality can be made possible by electrical measurement.

The reason for this is that the the conventional evaluation elements for evaluating the electrical characteristics of wirings or vias are formed by connecting all the elements in series, so that a nondestructive inspection involving electrical measurement becomes invalidated when a disconnection is observed. In contrast, in the present invention, the evaluation circuits are connected in parallel, so that it is possible to maintain the connection as an evaluation elements even if a disconnection occurs in a part of the circuit, and the evaluation elements make it possible to perform nondestructive inspection that involves an electrical measurement.

A second effect of the invention is that it allows a handy and sure failure analysis.

The reason for this is that the spacing between vias and the spacing between the wirings are laid out and designed in conformity to the failure analysis method so that when abnormality is detected, the abnormality location can be specified by the use of a nondestructive failure analysis technique such as the OBIRCH method which observes the current path by the temperature change induced by the laser beam, eliminating troublesome processing such as removal of covering films and sample holding in a vacuum required in the potential contrast method which is a semi-destructive analysis technique.

Although the invention has been described with reference to specific embodiments, this description is not meant to be construed in a limiting sense. Various modifications of the disclosed embodiments will become apparent to persons skilled in the art upon reference to the description of the invention. It is therefore contemplated that the appended claims will cover any modifications or embodiments as fall within the true scope of the invention.

What is claimed is:

1. In a semiconductor device including evaluation elements comprising a plurality of first wirings composed of a first wiring layer, a plurality of second wirings composed of a second wiring layer and via-holes (vias for short) connecting said first wirings and said second wirings, the semiconductor device including evaluation elements wherein said first wirings and said second wirings are formed respectively in directions almost perpendicular with each other, and relative to the plurality of said first wirings juxtaposed with a prescribed spacing, the plurality of said second wirings that connect said adjacent first wirings are juxtaposed in the length direction of said first wirings, and a plurality of current paths are formed in parallel.

2. The semiconductor device including evaluation elements as claimed in claim 1, wherein at least either one of the spacing between said vias provided at both ends of said second wirings or the spacing between said second wirings is set to be not less than the diameter of laser beam used in the measurement of current change induced by the laser.

* * * * *